United States Patent
Yoo et al.

(10) Patent No.: US 7,799,584 B2
(45) Date of Patent: Sep. 21, 2010

(54) ATTACHING DEVICE AND METHOD OF FABRICATING ORGANIC LIGHT EMMITING DEVICE USING THE SAME

(75) Inventors: Choong Keun Yoo, Anyang-si (KR); Ae Kyung Jeon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/819,932

(22) Filed: Jun. 29, 2007

(65) Prior Publication Data

US 2008/0003706 A1   Jan. 3, 2008

(30) Foreign Application Priority Data

Jun. 30, 2006   (KR) .................. 10-2006-0061146

(51) Int. Cl.
*H01L 21/00* (2006.01)
(52) U.S. Cl. .......................... 438/22; 257/13
(58) Field of Classification Search .................. 438/22
See application file for complete search history.

(56) References Cited

U.S. PATENT DOCUMENTS

| 5,933,314 | A | * | 8/1999 | Lambson et al. | ............ 361/234 |
| 7,142,406 | B2 | * | 11/2006 | Kwon | ......................... 361/234 |
| 2003/0145943 | A1 | * | 8/2003 | Lee et al. | .................... 156/285 |
| 2004/0195959 | A1 | * | 10/2004 | Park et al. | ..................... 313/500 |
| 2006/0076232 | A1 | * | 4/2006 | Miller et al. | ........... 204/192.12 |

FOREIGN PATENT DOCUMENTS

| JP | 2002-229044 | 8/2002 |
| JP | 2003-233080 | 8/2003 |
| JP | 2003-315759 | 11/2003 |
| JP | 2005-317273 | 11/2005 |
| JP | 2006-086504 | 3/2006 |
| JP | 2006-119286 | 5/2006 |
| WO | WO 2005/109489 | 11/2005 |

* cited by examiner

*Primary Examiner*—Quoc D Hoang
*Assistant Examiner*—Tony Tran
(74) *Attorney, Agent, or Firm*—McKenna Long & Aldridge LLP

(57) ABSTRACT

An attaching device and a method of manufacturing a light emitting device using the same are provided. The attaching device includes a process chamber, first and second supporters, and an open-close valve. The first and second supporters are disposed inside the process chamber to safely load and fix substrates. The open-close valve is disposed at a predetermined area of the process chamber to control a pressure inside the process chamber by opening and closing the process chamber. At least one of the first and second substrate supporters includes an electro static chuck including more than two of electrodes having different polarities and a polarity inverting unit for inverting polarities of the electrodes.

13 Claims, 4 Drawing Sheets

ATTACHING DEVICE AND METHOD OF FABRICATING ORGANIC LIGHT EMMITING DEVICE USING THE SAME

This application claims the benefit of Korea Patent Application No. 10-2006-0061146 filed in Korea on Jun. 30, 2006, which is incorporated herein by reference for all purposes as if fully set forth herein.

BACKGROUND OF THE INVENTION

1. Field of the Invention

An exemplary embodiment of the present invention relates to an attaching device and a method of fabricating an organic light emitting device using the same.

2. Discussion of the Related Art

Out of flat panel display devices, light emitting devices are a self-emissive type device that emits light by electrically exciting a compound. Since the light emitting devices do not need a backlight unit which is used in a liquid crystal display (LCD), the light emitting devices can be fabricated to be thin and light through a simple fabrication process. Furthermore, the light emitting devices can be fabricated at low temperature environment, and have characteristics of fast response time, low power consumption, excellent viewing angle, and high contrast.

In Particular, an organic light emitting device comprises an organic light-emitting layer between an anode electrode and a cathode electrode. The organic light emitting device forms an exciton, which is a hole-electron pair, by combining holes received from the anode electrode and electrons received from the cathode electrode inside the organic light-emitting layer, and emits light by energy generated when the exciton returns to a ground level.

In general, the organic light emitting device is fabricated by forming thin film transistors on a substrate, forming organic light emitting diodes on the thin film transistors to be electrically connected to the thin film transistors, and attaching the substrate to an encapsulation substrate. When the light emitting diode is bad although the thin film transistors are good, the organic light emitting device is determined as a defective good. In other words, process time and fabrication cost of the organic light emitting device may be wasted because the yield of the organic light emitting device is determined by the yield of an organic light emitting diode.

In order to overcome such a problem, an organic light emitting device was fabricated through the following processes. That is, a thin film transistor (TFT) array substrate provided with thin film transistors and an organic light emitting diode (OLED) array substrate provided with organic light emitting diodes were fabricated separately. A physical pressure was then applied to the TFT and OLED array substrates inside a process chamber to attach the TFT array substrate to the OLED array substrate.

However, it is difficult to uniformly maintain flatness between substrate supporters supporting the two substrates inside the process chamber when attaching the two substrates. It is also difficult to closely attach the entire surfaces of the substrates to the substrate supporters. Such difficulties reduce the process yield and increase fabrication cost of the organic light emitting device.

With a recent trend toward large-sized organic light emitting devices, the organic light emitting devices may be damaged because a pressure is applied to a portion of two substrates when attaching the two substrates. Therefore, life span and reliability of the organic light emitting devices are reduced.

SUMMARY OF THE INVENTION

An exemplary embodiment of the present invention provides a method of manufacturing an organic light emitting device for increasing a yield of manufacturing an organic light emitting device and a lift time of an organic light emitting device.

In an aspect, an attaching device comprises a process chamber, first and second supporters, and an open-close valve. The first and second supporters are disposed in the process chamber for safely loading and fixing substrates. The open-close valve is disposed at a predetermined area of the process chamber for controlling a pressure of an inside of the process chamber by opening and closing the process chamber. At least one of the first and second substrate supporters comprises an electro static chuck comprising more than two of electrodes having different polarities and a polarity inverting unit for inverting polarities of the electrodes.

In another aspect, a method of manufacturing a light emitting device comprises preparing a first substrate and a second substrate, coating sealant on a predetermined area of the first and second substrates, safely loading the first and second substrate on first and second substrate supporters inside a process chamber comprising the first and second substrate supporters and an open-close valve for safely loading and fixing the first and second substrates by electrostatic force, moving the second substrate supporter on which the second substrate is disposed to align the first and second substrates, detaching the second substrate from the second substrate supporter through inverting a polarity of electrostatic force of the second substrate supporter to attach the first and second substrates to each other, injecting an air into the process chamber through the open-close valve to apply atmosphere pressure to the outside of the attached first and second substrates, and hardening the sealant to seal the first and second substrates.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
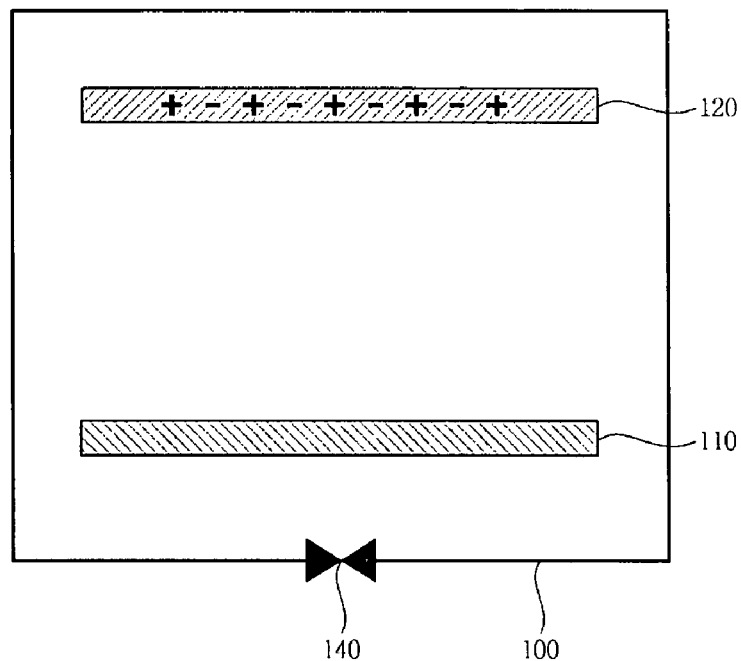
FIG. 1 is a schematic diagram illustrating an attaching device according to an exemplary embodiment of the present invention.

FIG. 1 is a schematic diagram illustrating an attaching device according to an exemplary embodiment of the present invention.

Referring to FIG. 1, the attaching device according to the present embodiment comprises a process chamber 100, first and second substrate supporters 110 and 120 for loading, fixing, and supporting substrates, and an open-close valve 140 for controlling the pressure in the process chamber 100.

The first and second substrate supporters 110 and 120 safely load and fix substrates inside the process chamber 100 and sustain the substrates to be fixed at corresponding processing locations in the process chamber 100.

Also, at least one of the first and second substrate supporters 110 and 120 comprises a moving unit (not shown) for aligning substrates located on the first and second substrate supporters 110 and 120 by moving the first and second supporters 110 and 120 in an upward direction and a downward direction. The moving unit (not shown) may comprise a moving shaft and a driving motor, and selectively move the first and second substrate supporters 110 and 120.

Figure 2:
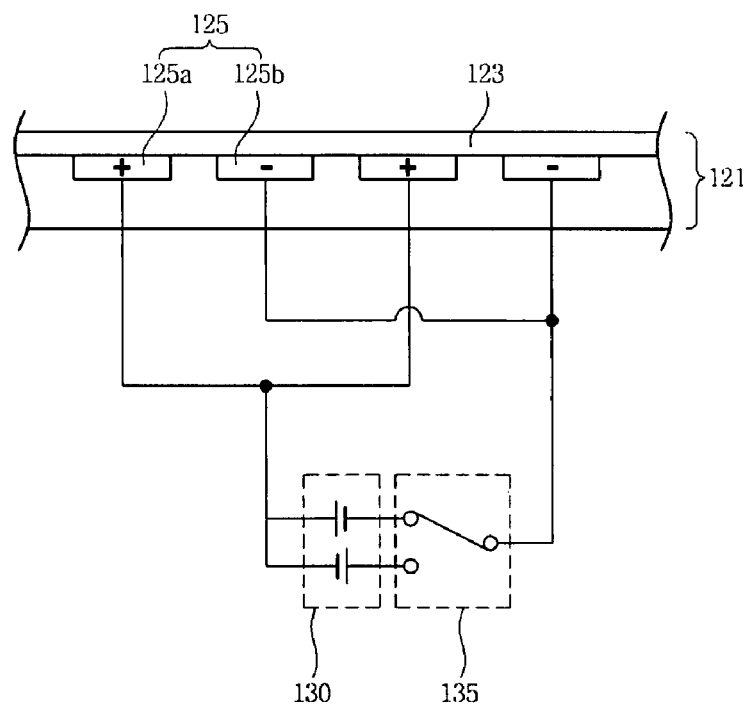
FIG. 2 is a cross-sectional view of an electro static chuck of an attaching device according to an exemplary embodiment of the present invention.

FIG. 2 is a cross-sectional view of an electro static chuck of an attaching device according to an exemplary embodiment of the present invention.

Referring to FIG. 1 and FIG. 2, the second substrate supporter 120 may comprise an electrostatic chuck ESC 121 for fixing substrates by providing electrostatic in the process chamber. The electrostatic chuck 121 may comprise an insulating layer 123 and an electrode layer 125 formed on one side of the insulating layer 123. A substrate may be formed on the other side of the insulating layer 123, and electrostatic field may be formed between the substrate and an electrode layer 125 with an insulating layer 123 interposed.

The electrode layer 125 comprises at least two of electrodes 125a and 125b having different polarities by receiving different polarities of voltages to provide electrostatic force to attach the substrates.

The second substrate supporter 120 may comprise a power supply 130. The power supply 130 applies direct current (DC) voltages having different polarities to a pair of electrodes 125a and 125b connected to the electrode layer 125 in order to enable the electrode 125a and 125b to have different polarities. The power supply 130 may comprise two voltage sources in order to selectively provide power having different polarities to one electrode 125a.

The second substrate supporter 120 may comprise a polarity inverting unit 135 for inverting the polarities of the electrodes 125a and 125b. The polarity inverting unit 135 may comprise switching elements. In FIG. 2, the polarity of electrostatic force can be inverted by changing polarity of the power applied to the electrodes 125a and 125b which are selectively connected to the power supply 130.

However, the power supply 130 and the polarity inverting unit 135 are not limited to those described above. Any units that can provide electrostatic force and invert polarity can be used.

Meanwhile, the second substrate supporter 120 may comprise a ground unit (not shown) for removing electrostatic force from the second substrate supporter 120 to easily detach the substrate from the second substrate supporter 120 by inverting polarity of electrostatic force.

Referring to FIG. 1 again, the open-close 140 may be disposed at a lower part of the process chamber 100. The open-close valve 140 may be connected to a pressure controller (not shown) comprising a pressure pump (not shown) to control the pressure inside the process chamber 100.

FIG. 3 through FIG. 8 are schematic diagrams sequentially illustrating each of stages in a method of manufacturing a light emitting device using an attaching device shown in FIGS. 1 and 2.

Figure 3:
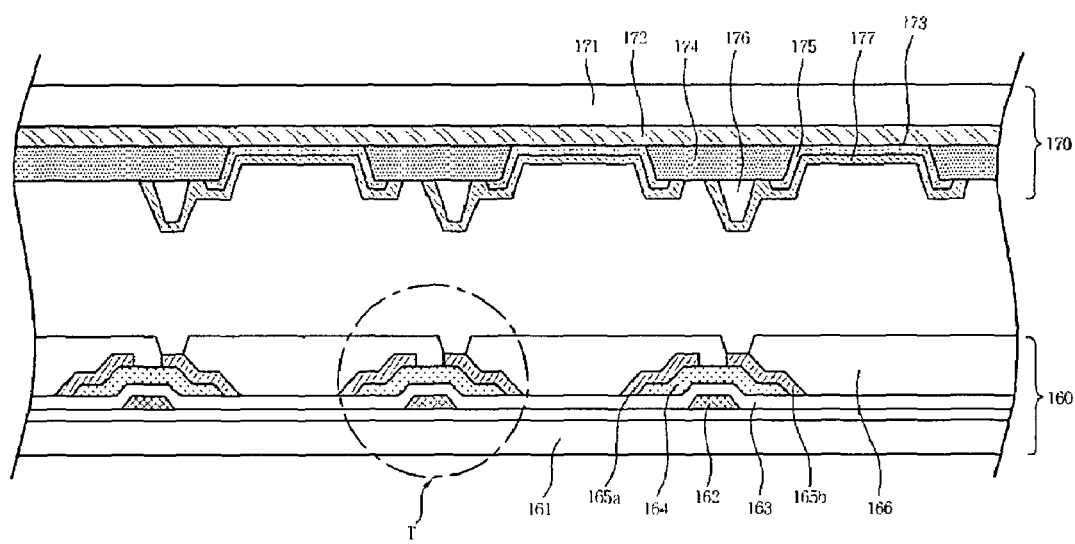
FIG. 3 through FIG. 8 are schematic diagrams sequentially illustrating each of stages in a method of manufacturing a light emitting device using an attaching device according to an exemplary embodiment of the present invention.

Referring to FIG. 3, a first substrate 160 and a second substrate 170 are prepared. Herein, the first substrate 160 may be a thin film transistor (TFT) array substrate provided with thin film transistors, and the second substrate 170 may be an organic light emitting diode (OLED) array substrate provided with light emitting diodes.

At first, the structure of the first substrate 160 will be described. A gate electrode 162 is disposed on a first base substrate 161, and a first insulating layer 163 is disposed on a substrate 161 having a gate electrode 162 as a gate insulating layer. A semiconductor layer 164 is disposed on the first insulating layer 163 to have a predetermined area corresponding to the gate electrode 162. A source electrode and a drain electrode 165a and 165b are disposed on a predetermined area of a semiconductor layer 164. A second insulating layer 66 may be formed to expose a predetermined area of the source electrode and the drain electrodes 165a and 165b. Although the thin film transistor T was described as a bottom gate structure in an exemplary embodiment of the present embodiment, an exemplary embodiment of the present invention is not limited thereto. The thin film transistor T may be formed as a top gate structure.

In the second substrate 170, an upper electrode 172 is disposed on a second base substrate 171. The upper electrode 172 may be an anode electrode, and formed as a transparent electrode made of indium tin oxide (ITO). An opening 173 is formed on the upper electrode 172 to expose a predetermined area of the upper electrode 172. A third insulating layer 124 may be disposed on the upper electrode 172 to define each pixel. An organic light-emitting layer 175 is disposed in the opening of the third insulating layer 174, and a contact spacer 176 may be disposed on the third insulating layer 174. A lower electrode 177 patterned according to each pixel may be disposed on a second base substrate 171 comprising the organic light-emitting layer 175 and the contact spacer 176. The lower electrode 177 may be a cathode and formed of metal having high work function such as aluminum and magnesium. The predetermined area of the lower electrode 177 formed on the contact is electrically connected to a drain electrode 165b when the second substrate 170 is attached to the first substrate 160.

A sealant 180 may be coated on a predetermined area of the first substrate 160 in order to attach the first and second substrates 160 and 170 and seal the inside of the attached first and second substrate.

Figure 4:
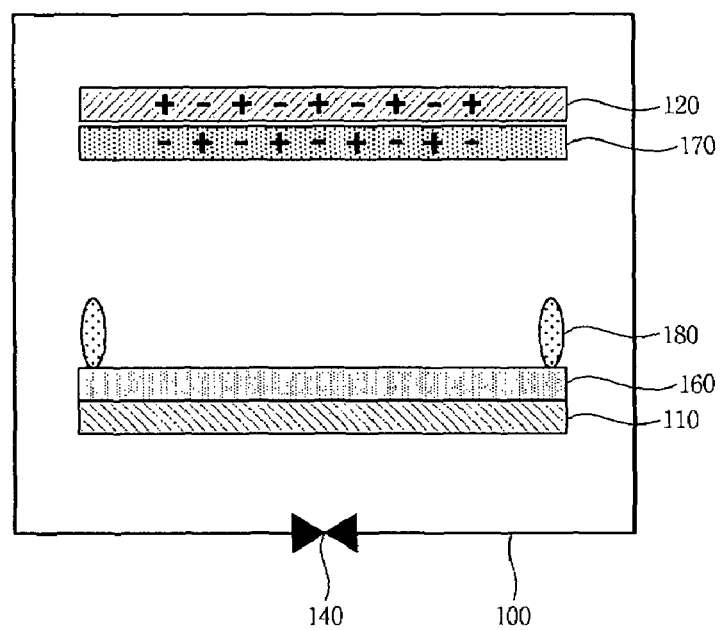

Referring to FIG. 4, the first and second substrates 160 and 170 thus manufactured are loaded inside the process chamber 100. The process chamber 100 is in a vacuum state of about $10^{-3}$ or $10^{-8}$ Torr, and the open-close valve 140 remains in a closed state. Although it is not shown, a substrate loading machine having at least one of robot arms may be used to load the first and second substrates 160 and 170 inside the process chamber 100.

The first and second substrates 160 and 170 may be safely loaded on each of the first and second substrate supporters 110 and 120 inside the process chamber 100. The first and second substrate supporters 110 and 120 comprise at least one of electrostatic chuck ESC (not shown) and fix the first and second substrates 160 and 170 by the electrostatic force.

The electro static chuck may comprise more than two electrodes having different polarities. As shown in FIG. 3, the second substrate supporter 120 may have electrostatic force having continuously repeated arrangements of positive and negative charges. The second substrate supporter 120 can fix the second substrate 170 by magnetic attraction formed between the electrodes and the second substrate 170 by arranging the polarities of the second substrate 170 or arranging opposite polarities of the second substrate 170.

Figure 5:
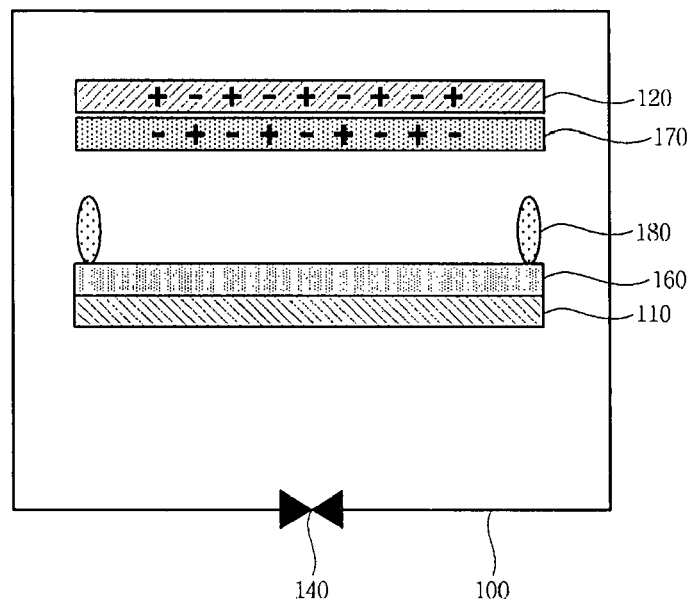

Referring to FIG. 5, the first and second substrates 160 and 170 are aligned by moving the first substrate supporter 110 with the first substrate 160 loaded thereon closely to the second substrate supporter 120. To accurately align the first and second substrates 160 and 170, it is preferable to closely attach the first and second substrates 160 and 170 to have a gap between the first and second substrate 160 and 176 close to several hundred micrometer.

Figure 6:
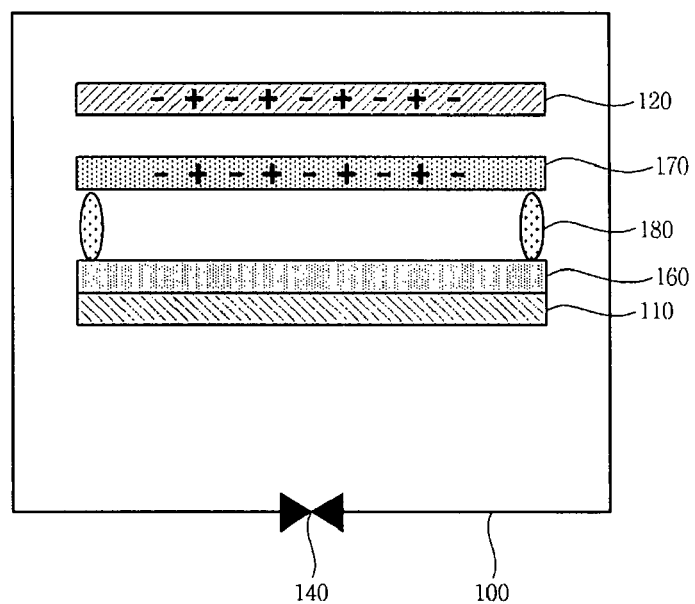

Referring to FIG. 6, the second substrate 170 is detached from the second substrate supporter 120 by inverting the polarities of electrodes of the second substrate supporter 120. That is, if the polarity of the electrodes is inverted, a repulsive force is generated between the second substrate supporter 120 and the second substrate 170 as shown in FIG. 6. Therefore, the second substrate 170 is detached from the second substrate supporter 120 and free-falls to be disposed on the first substrate 160. Therefore, the first and second substrates 160 and 170 are attached to each other.

In order to easily detach the second substrate 170, a ground unit (not shown) of the second substrate supporter 120 may be used to remove the electrostatic force after inverting the polarity of the second substrate supporter 120. That is, the second substrate 170 can be easily detached by removing the remained electrostatic force from the second substrate supporter 120.

Since the process chamber 100 sustains a vacuum state when the first and second substrates 160 and 170 are attached to each other, the inside of the first and second substrates 160 and 170 is also sustained as a vacuum state. Therefore, the deterioration of light emitting diodes by oxygen and humidity is minimized, and the light emitting diodes are prevented from being damaged by preventing impurity from being penetrated during the attaching process.

Figure 7:
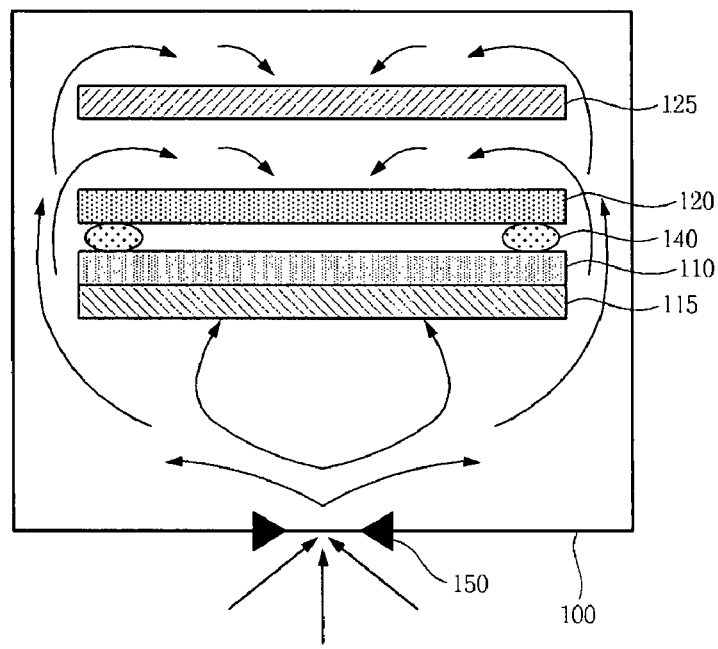

Referring to FIG. 7, the air is injected into the process chamber 100 for about several seconds or minutes by opening the open-close valve 140 disposed at the lower part of the process chamber 100. Also, an inert gas such as nitrogen $N_2$ or argon Ar may be used. As a result, the inside of the process chamber 100 becomes atmospheric pressure.

At this time, the inside of the attached first and second substrates 160 and 170 is sustained as a vacuum state, and the process chamber 100, the outside of the first and second substrates 160 and 170, is in an atmospheric pressure state. Such a pressure difference makes the first and second substrates 160 and 170 to be further closely attached with the inside of the first and second substrates 160 and 170 sustained at the vacuum state.

Figure 8:
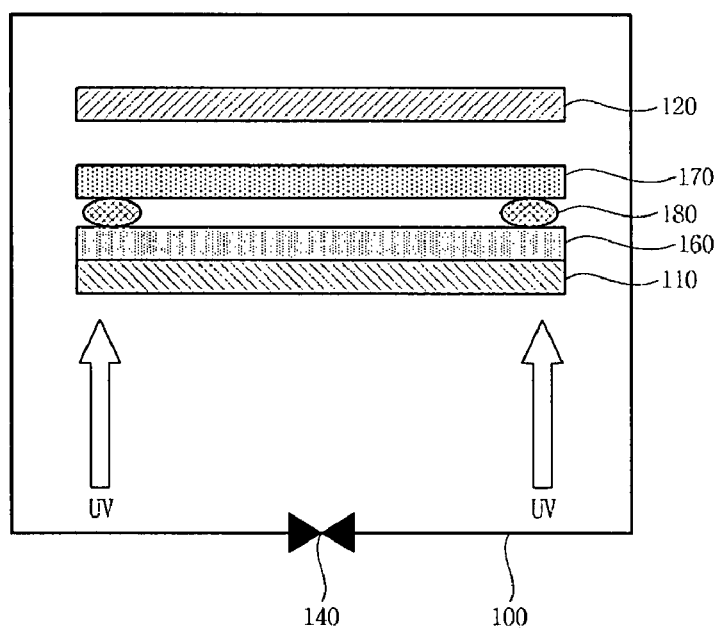

Referring to FIG. 8, a sealant 180 is hardened by radiating ultra violet (UV) to a predetermined area of the attached first and second substrates 160 and 170. The inside of the first and second substrates 160 and 170 is sealed by the sealant 180, thereby completely manufacturing the organic light emitting device.

To attach the first and second substrates 160 and 170, the attaching device according to an embodiment of the present invention detaches the second substrate 170 from the second substrate supporter 120 by inverting the polarity of the electrostatic force of the second substrate supporter 120 as described above. As a result, the inside of the attached first and second substrates 160 and 170 can be sustained as a vacuum state. That is, the manufacturing yield and the life time of the organic light emitting device can be improved by preventing light emitting diode from being deteriorated or polluted by impurity.

That is, the manufacturing yield of the organic light emitting device can be improved, and an organic light emitting device having improved life time and reliability can be provided.

It will be apparent to those skilled in the art that various modifications and variations can be made in the liquid crystal display device and array substrate for the same of the present invention without departing from the spirit or scope of the invention. Thus, it is intended that the present invention covers the modifications and variations of this invention provided they come within the scope of the appended claims and their equivalents.

What is claimed is:

1. A method of manufacturing a light emitting device comprising:
    preparing a first substrate and a second substrate;
    coating sealant on a predetermined area of the first and second substrates;
    safely loading the first and second substrate on first and second substrate supporters inside a process chamber comprising the first and second substrate supporters and an open-close valve for safely loading and fixing the first and second substrates by electrostatic force;
    moving the second substrate supporter on which the second substrate is disposed to align the first and second substrates;
    detaching the second substrate from the second substrate supporter through inverting a polarity of electrostatic force of the second substrate supporter to attach the first and second substrates to each other;
    injecting air into the process chamber through the open-close valve to apply atmosphere pressure to the outside of the attached first and second substrates; and
    hardening the sealant to seal the first and second substrates,
    wherein the second substrate supporter comprises an electro static chuck comprising more than two electrodes having different polarity and a polarity inverting unit for inverting polarities of the electrodes,
    wherein in attaching the first and second substrates, the second substrate free-falls before attaching the first and second substrates by inverting the polarities of the electrodes using the polarity inverting unit, and is disposed on the first substrate,
    wherein if the polarity of the electrodes is inverted, a repulsive force is generated between the second substrate supporter and the second substrate.

2. The method of claim 1, wherein at least one of the first and second substrate supporters comprises a voltage supply for applying a voltage to the electrodes.

3. The method of claim 1, wherein at lest one of the first and second substrate supporters further comprises a ground unit for removing electrostatic force.

4. The method of claim 3, wherein in attaching the first and second substrates, the electrostatic force of the second substrate is removed using the ground unit after inverting the polarity of the electrostatic force.

5. The method of claim 1, wherein the process chamber remains in a vacuum state of about $10^{-3}$ to about $10^{-8}$ Torr before applying an atmosphere pressure.

6. The method of claim 1, wherein ultraviolet (UV) rays are irradiated to the sealant in the sealing of the first and seconds substrates.

7. The method of claim 1, wherein the first substrate is a TFT (thin film transistor) array substrate provided with thin film transistors.

8. The method of claim 7, wherein the thin film transistor comprises a semiconductor layer, a gate electrode having a predetermined area corresponding to the semiconductor layer, a gate insulating layer interposed between the semiconductor layer and the gate electrode, and a source electrode and a drain electrode electrically connected to a predetermined area of the semiconductor layer.

9. The method of claim 8, wherein the second substrate is an OLED (organic light emitting diode) array substrate provided with light emitting diodes.

10. The method of claim 9, wherein the light emitting diode comprises a lower electrode, a light-emitting layer, and an upper electrode.

11. The method of claim 9, wherein the light-emitting layer is formed of organic material.

12. The method of claim 9, wherein the upper electrode is an anode formed of a transparent conductive layer.

13. The method of claim 9, wherein the drain electrode and the lower electrode are electrically connected to each other when the first and second substrates are attached.

* * * * *